(12) United States Patent
Jin et al.

(10) Patent No.: US 6,172,625 B1
(45) Date of Patent: Jan. 9, 2001

(54) DISAMBIGUATION METHOD AND APPARATUS, AND DICTIONARY DATA COMPRESSION TECHNIQUES

(75) Inventors: Guo Jin, Sunnyvale; Sreeram Balakrishnan, San Francisco, both of CA (US)

(73) Assignee: Motorola, Inc., Schaumburg, IL (US)

( * ) Notice: Under 35 U.S.C. 154(b), the term of this patent shall be extended for 0 days.

(21) Appl. No.: 09/350,271

(22) Filed: Jul. 6, 1999

(51) Int. Cl.$^7$ ...................................... H03M 7/48
(52) U.S. Cl. .................... 341/67; 341/23; 341/106; 379/368; 379/52
(58) Field of Search ................... 341/67, 28, 23, 341/106; 379/368, 74, 52, 93; 345/326; 382/232, 305; 370/395; 711/221; 325/240.23

(56) References Cited

U.S. PATENT DOCUMENTS

| | | | |
|---|---|---|---|
| 4,817,129 | * 3/1989 | Riskin | 379/88.24 |
| 5,101,487 | * 3/1992 | Zalenski | 711/221 |
| 5,128,672 | * 7/1992 | Kaehler | 341/23 |
| 5,200,988 | * 4/1993 | Riskin | 379/52 |
| 5,253,053 | * 10/1993 | Chu | 375/240.23 |
| 5,488,366 | * 1/1996 | Wu | 341/67 |
| 5,572,208 | * 11/1996 | Wu | 341/67 |
| 5,589,829 | * 12/1996 | Astle | 341/67 |
| 5,703,581 | * 12/1997 | Matias | 341/67 |
| 5,768,445 | * 6/1998 | Troeller | 382/305 |
| 5,786,776 | * 7/1998 | Kisaichi | 341/23 |
| 5,818,437 | * 10/1998 | Grover | 345/326 |
| 6,034,958 | * 3/2000 | Wicklund | 370/395 |
| 6,091,853 | * 7/2000 | Otto | 382/232 |

\* cited by examiner

Primary Examiner—Michael Horabik
Assistant Examiner—Albert K. Wong
(74) Attorney, Agent, or Firm—Romi N. Bose

(57) ABSTRACT

A microprocessor 11 receives an ambiguous input from a key 2–9 and disambiguates the ambiguous input using a dictionary. The dictionary is stored in an efficient manner by being partitioned according to the first three letters of a word. A sequence of three letters in the dictionary is stored as eight bits of data, the first three letters of a word being stored using three pairs of bits, such that each pair of bits represents one of no more than four alternative letters.

6 Claims, 2 Drawing Sheets

DISAMBIGUATION METHOD AND APPARATUS, AND DICTIONARY DATA COMPRESSION TECHNIQUES

FIELD OF THE INVENTION

This invention relates to methods and apparatus for disambiguation of ambiguous data entry and it relates to compression of dictionary information for efficient storage in data entry devices such as handwriting recognition devices, reduced keyboard disambiguation devices, speech recognition devices and the like.

BACKGROUND OF THE INVENTION

In the field of data entry devices such as devices that use handwriting and speech recognition and other data entry techniques, there is a need to store extensive volumes of data to assist in recognition, disambiguation or word selection and processing. In the world of mobile computing and mobile communications, memory space is very limited or is expensive and there is a need to minimize the space occupied by such data.

In the field of data entry, arrangements are known (for example as described in U.S. patent application Ser. No. 08/754,453 of Balakrishnan, filed on Nov. 21, 1996, assigned to the assignee of the present invention and incorporated herein by reference) in which a reduced keyboard or keypad is used for character entry where each key ambiguously represents more than one character and disambiguation software is used to disambiguate a key entry to identify the probable intended key from the various ambiguous possibilities. In such a scheme, dictionary, word or n-gram data is necessary to perform the disambiguation. Large amounts of data are required to enable satisfactory disambiguation.

Data compression techniques exist for purposes such as bulk data storage. An example is gzip compression, which is suitable for compression of alphabetical text, and is explained here by way of background. The Roman alphabet comprises 26 letters a through z, which can readily be represented as a byte of eight bits of data. Eight bits of data allow one bit for a start-of-word indicator and 128 characters ($2^7$). Accordingly, such a scheme has 102 unused byte values (unused in the sense of being unnecessary for coding of 26 characters). In Gzip compression, the additional 102 byte values are used to encode character pairs. By way of example if it assumed that bits 0–25 are used for a through z, value 26 can be assigned to mean "ba", value 27 to mean "ca" etc., using 102 character pairs selected as the most common character pairs in the language in question (e.g. American English).

There is a need for an improved method of storage of dictionary or other data suitable for data entry disambiguation.

DETAILED DESCRIPTION OF THE DRAWINGS

Figure 1:
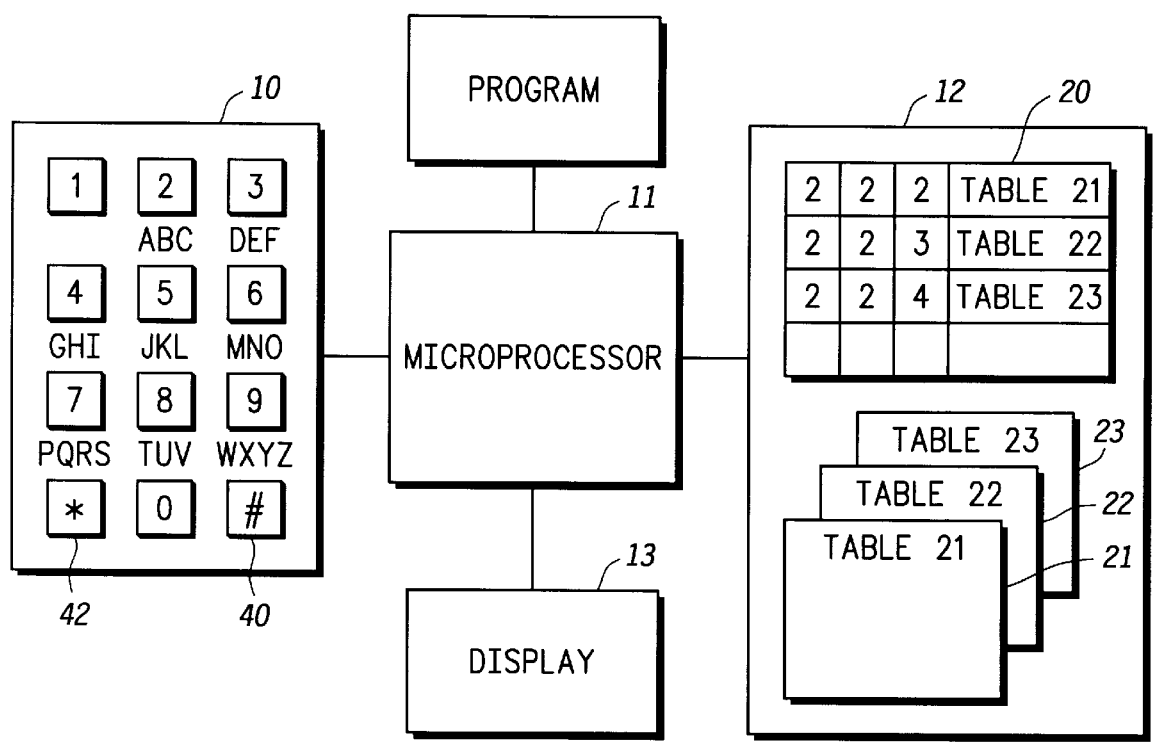
FIG. 1 is a block diagram illustrating a data entry device according to the invention, having a compressed dictionary.

Referring to FIG. 1, a data entry device is shown having a reduced keyboard or keypad 10 having twelve keys. Ten of the keys have the digits 0–9 marked thereon. Keys 2–9 also have the letters a–z marked on the keys or beside the keys, such that key 2 represents letter a, b, or c and key 3 represents letter d, e, or f, etc. in a manner that is standard for telephones in the United States. Other layouts for the keypad could be used, with different allocations of letters to keys, for example as described in "Probabilistic Character Disambiguation for Reduced Keyboards Using Small Text Samples" by J. L. Arnott and M. Y. Javed, Augmentative and Alternative Communication, Vol. 8, September 1992.

The keypad 10 is coupled to a microprocessor 11, which is coupled to a memory 12 (e.g. a read-only memory) and a display 13 in a manner known in the art. A program memory 14 is also shown coupled to the microprocessor 11 for completeness, although this can be the same memory as memory 12.

In operation, the microprocessor 11 receives an ambiguous input from a key 2–9 and calculates in a manner described below a word start n-gram probability from accumulated probabilities for words in the memory 12 beginning with the ambiguous input. The microprocessor disambiguates the ambiguous input using the word start n-gram probability so calculated.

Memory 12 is illustrated as having a look-up table 20 and a series (up to 512) of dictionary tables of which three are shown, labeled 21, 22 and 23. These will be described in greater detail.

Look-up table 20 has four columns and 512 rows (or vice-versa). The first three elements of a row are three digits that are possible key entries from keypad 10. The fourth element of a row is a number identifying a dictionary table from among the dictionary tables 21, 22 and 23 etc.

The dictionary tables 21, 22, 23 etc. together form a complete dictionary of words including common proper nouns and acronyms partitioned into sub-dictionaries (collectively referred to as "words"). The dictionary is partitioned according to the first three letters of each dictionary entry (word). Thus, all words beginning with a/b/c followed by a/b/c, followed by a/b/c appear in table 21 and all words beginning with a/b/c followed by a/b/c, followed by d/e/f appear in table 22, etc. Of course there may be combinations of letters that have no dictionary entries, in which case there will be fewer than 512 tables (for example there are no English language words beginning with w/x/y/z followed by w/x/y/z, followed by w/x/y/z and there may be no table for this combination, unless acronyms such as "www" are included).

By partitioning the dictionary in this manner, it is possible to more compactly store representations of words in the various tables. In each table, the first three characters of a word are represented by three pairs of bits. Thus, for example, in table 21, the first three letters of any word in the table are exclusively "a" or "b" or "c". In table 21, "a" is represented as 00, "b" is represented as 01, and "c" is represented as 00. An entry of "11" would be an error and would give an error indication or some other action such as no result.

In the tables 21–23 etc., the first three letters of a word are represented by a single byte of eight bits. The first bit is used as a word-start indicator (as in gzip compression), the second bit is used to indicate that the first letter is capitalized and the remaining six bits represent the three letters, where the actual interpretation of the bits into ultimate letters depends on the table being referenced. There now follows some examples for entries for tables 21 and 22. These examples give a miscellaneous selection of words from each table and are not necessarily complete. In these examples, the first three letters of each word are shown encoded as a byte and the remaining letters are shown unencoded. Any letters of a word in excess of three are coded using ordinary gzip compression already described.

TABLE 21

| words beginning with {a/b/c, a/b/c, a/b/c} | |
| --- | --- |
| aback | 10 10 01 10 ck |
| abbot | 10 10 01 01 ott |
| babble | 10 01 10 01 ble |
| back | 10 01 10 00 k |
| cab | 10 00 10 01 |
| cable | 10 00 10 01 le |

TABLE 2

| words beginning with {a/b/c, a/b/c, d/e/f} | |
| --- | --- |
| bad | 10 01 10 10 |
| Badminton | 11 01 10 10 minton |
| baffle | 10 01 10 00 fle |
| caddie | 10 00 10 10 die |
| cafe | 10 00 10 00 e |
| caffeine | 10 00 10 00 feine |

Note that the first digit of each word is "1" indicating start-of-word. This may appear redundant, but it should be noted that the letters to the left of each table entry will be encoded in further bytes, the first of which will begin "0". Note also that the second digit of the word "Badminton" is "1" indicating that the word is capitalized. In each entry, the second, third and fourth pairs of bits represent the first, second and third letters of the encoded word. It is not possible to decode a word from a table without reference to the table in which the word is stored. For each pair of bits in the second, third and fourth pairs of a byte, the selected correspondence between the bit-pair and the selection from among the ambiguous letters represented thereby is not critical, so long as the rules for determining that correspondence are fixed. Thus, in table 22, in the third position, "10" represents "d", "01" represents "e", "00" represents "f" and "11" would be an error state. Similar correspondences are selected for other letters g–z.

From these examples, it can be seen that a three-letter word such as "cab" or "bad" can be encoded in a single byte. A four-letter word such as "back" can be encoded with just two bytes, where the second byte is a gzip representation of "k" (e.g. decimal 10 represented in binary, where k is the eleventh letter of the alphabet and a–z are represented as decimal 0–25). A five letter word can also be represented in just two bytes if the fourth and fifth letter pair is one of the 102 most-common two-letter combinations representable as decimal 26–127.

One-letter and two-letter words are treated as special cases and supported with an extra one-letter table (8 rows each for key 2–9, and 3 to 4 columns for letters under the key) and two-letter tables (8×8×5, for up to 5 words under each two-key combinations).

This level of dictionary compression is an improvement over the prior art, in which at least two bytes were necessary to encode three letters and at least three bytes were necessary to encode five letters. In fact, the average length of a word in the English language is just five letters, so compression of the first three letters gives a substantial saving in space in dictionary storage. Simulations have shown that a 20% compression gain can be achieved using this method. There is an overhead cost in terms of the need to store table 20, but this is a relatively small table and the measured gain of 20% is achieved after including table 20.

Figure 2:
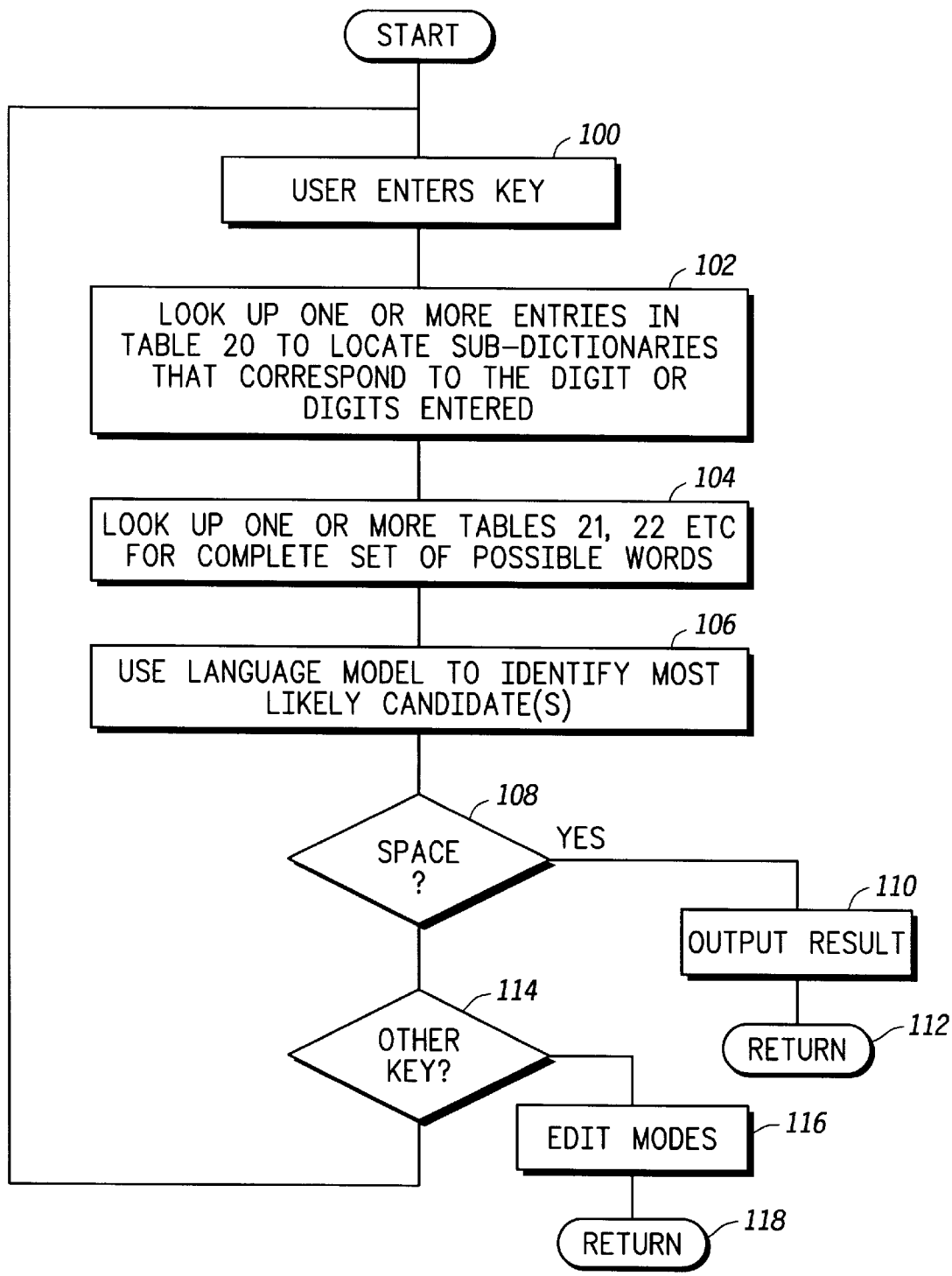
FIG. 2 is a flow diagram illustrating a computer program stored in memory in the device of FIG. 1 and executed on the microprocessor of FIG. 1.

Operation of the device of FIG. 1 will now be described with reference to the flow diagram of FIG. 2.

In operation, the user strikes a key of the keypad 10 to enter a letter (step 100). The microprocessor 11 performs a look-up operation in table 20 to determine which of the tables 21, 22, 23 etc. are valid for the key or keys so far entered. In the case where only one key has so far been entered, there will be 64 valid tables. The microprocessor 11 identifies these tables in step 102. Following identification of the tables, the microprocessor performs a look-up in the tables (step 104) to identify a complete set of possible words that include the word being entered by the user. In step 106, the microprocessor 11 uses language model data to identify one or more of the possible words that is the most likely candidate for the key sequence being entered.

In step 106, the most likely entered key is preferably identified by the order of storage of the words in the dictionary. It is preferred that the words in the dictionary are stored in order of decreasing frequency of usage in the language in question, with the most common words being stored at lower order addresses and least common words being stored at higher order addresses (or vice-versa).

In this manner, where there are three ambiguous possibilities for a given letter, (e.g. "a", "b" and "c") the letter identified first in the words of the dictionary (in word address order) is selected as the most likely desired result. This letter is present in the display 13 to the user. The second and third most likely candidates (and the forth if relevant) can also be displayed.

This method is particularly useful for entry of Chinese characters. The characters are stored in frequency order as stroke sequences. (Incidentally, a character can be stored and represented in more than one possible stroke order.) When a stroke is entered (i.e. a classification of stroke or an ambiguous selection of one of a plurality of strokes in a set) at a position in a sequence of entered strokes, the first character in the dictionary that is formed using the entered stroke (at that position in a sequence of strokes) appears foremost as the most likely desired result. Other characters that are formed using the same stroke at the same position in the same sequence appear lower down the order.

Thus, in a single device, the same search software is used for English and Chinese, and the dictionary is selected by the user according to the language desired. The dictionary of words is a dictionary of Roman alphabet words and is interchangeable in the device with a dictionary of ideograhpic characters (e.g. Chinese or Japanese characters). The two dictionaries are searched by a common search engine (search software) using the technique described.

There are alternative ways of providing language model data. One alternative is to use n-gram data as described in the paper by Arnott described above. Another alternative is to provide an absolute score for each word in the dictionary and to display an entire word in the display 13, where the first choice is the word that has the highest score (i.e. is the most common of the words as used in the language in question).

The dictionary is preferably exclusively a dictionary of words, but may include acronyms and common misspellings of words and may include word stems. Also it may include common letter combinations that are not word stems but are found in non-dictionary words (e.g. found in proper nouns). Accordingly, in the preferred embodiment, the n-gram probabilities calculated are all or substantially all word-start n-grams.

Returning to FIG. 2, in step 108, a determination is made as to whether a space key has been pressed. The space key can be any key otherwise not assigned (for example key 40 of FIG. 1). The space key indicates that a complete word has been entered or that the currently displayed word is the desired result. If the space key is pressed, the desired result is output at step 110. In step 110, the selected or first displayed word or acronym is transferred into an output buffer or text display area of the display 13. Following step 110, the entry of a complete word is completed and the program returns step 112 for commencement of the next word. If a space is not yet entered, the program determines at step 114 whether some other key has been pressed, for example for correcting or editing. If, for example, key 42 has been pressed, an editing mode can be entered at step 116. In the editing mode, previously entered digits can be counseled or corrected and other functions can be carried out. Following editing, the program returns at step 118 for the next key entry. If, following step 114, no space key and no other key has been pressed, the process returns to step 100 for entry of the next key from keys 2–9. Steps 100–106 are repeated for a second digit and a third digit, i.e. second letter and a third letter. After a third letter has been entered, step 102 can be skipped, because after entry of a third letter there will be only one remaining table that needs to be searched for the desired word. After entry of the third key, further disambiguation relies on the dictionary bytes after the first byte, i.e. dictionary bytes that represent the remainder of each dictionary word beyond the first three letters where the remainder of the word is encoded using gzip compression.

Accordingly, a method and apparatus for data entry has been described in which entered data is disambiguated using a dictionary that is partitioned and where the partitioning of the dictionary is dependant on at least the first letter of each dictionary word and preferably the first three letters of each dictionary word and wherein the compressed dictionary has pairs of bits, where a pair of bits represents one of no more than four alternative letters of the alternative letters being represented by a pair of bits being letters that are ambiguously represented by a digit in a reduced key pad that has multiple keys, where each key represents more than one character.

The invention can be applied to stroke-based character entry, such as described in U.S. patent application Ser. No. 09/220,308 of Guo filed on Dec. 23, 1998, which is assigned to the assignee of the present invention and is hereby incorporated by reference. For these purposes, the term "letter" encompasses a stroke of an ideographic character, and the term "word" encompasses an ideographic character made up of strokes.

Modifications of detail of the invention can be made by one of ordinary skill in the art without departing there from and all such modifications are included in the scope and spirit of the invention.

What is claimed is:

1. A method of compression of data comprising:
    storing a sequence of three letters as eight bits of data, wherein the first three letters of a word are stored using three pairs of bits, such that each pair of bits represents one of no more than four alternative letters, wherein the data is partitioned according to the first three letters of a word.

2. The method of claim 1, wherein, of each set of eight bits representing three letters, one bit is reserved for a word start flag.

3. A data input device comprising:
    a plurality of inputs, each representative of a letter from an ambiguous set of letters;
    a dictionary of words, wherein the dictionary is partitioned according to the first three letters of a word, and wherein a sequence of three letters in the dictionary is stored as eight bits of data, the first three letters of a word being stored using three pairs of bits, such that each pair of bits represents one of no more than four alternative letters.

4. The device of claim 3, further comprising a one-letter table of one-letter words.

5. The device of claim 3, further comprising a two-letter table of two-letter words.

6. The device of claim 3, wherein the dictionary of words is a dictionary of Roman alphabet words and is interchangeable in the device with a dictionary of ideograhpic characters searchable by a common search engine.

* * * * *

UNITED STATES PATENT AND TRADEMARK OFFICE
CERTIFICATE OF CORRECTION

PATENT NO. : 6,172,625 B1  
DATED : January 9, 2001  
INVENTOR(S) : Guo, Jin et al.

Page 1 of 1

It is certified that error appears in the above-identified patent and that said Letters Patent is hereby corrected as shown below:

Title page
Under [19]: change "Jin et al." to Guo et al.
Inventors: change "Guo Jin", to Jin Guo Signed and Sealed this Twenty fifth Day of September, 2001

Attest:

Attesting Officer

NICHOLAS P. GODICI
Acting Director of the United States Patent and Trademark Office